United States Patent
Ngo et al.

(10) Patent No.: US 7,068,450 B2
(45) Date of Patent: Jun. 27, 2006

(54) HIGH SPEED PRE-DRIVER WITH VOLTAGE REFERENCE FOR THIN FILM HEAD WRITE DRIVER

(75) Inventors: Tuan Van Ngo, Eden Prairie, MN (US); Raymond Elijah Barnett, Apple Valley, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/786,967

(22) Filed: Feb. 25, 2004

(65) Prior Publication Data

US 2005/0185315 A1   Aug. 25, 2005

(51) Int. Cl.
*G11B 5/02* (2006.01)
*G11B 15/12* (2006.01)

(52) U.S. Cl. .................................. 360/46.66; 360/68
(58) Field of Classification Search ............ 360/67–68, 360/46
See application file for complete search history.

(56) References Cited

U.S. PATENT DOCUMENTS

| | | | | |
|---|---|---|---|---|
| 5,287,231 A | * | 2/1994 | Shier et al. | 360/68 |
| 5,386,328 A | * | 1/1995 | Chiou et al. | 360/68 |
| 6,324,028 B1 | * | 11/2001 | Ramalho et al. | 360/68 |

* cited by examiner

*Primary Examiner*—David Hudspeth
*Assistant Examiner*—Varsha A. Kapadia
(74) *Attorney, Agent, or Firm*—W. James Brady, III; Frederick J. Telecky, Jr.

(57) ABSTRACT

A preamplifier device (26) for a thin film transducer disk drive system having operation speeds up to and greater than 2 Gb/s. The device (26) includes a low power/high speed driver (203) having a cascaded Class AB buffer. In at least one embodiment the device (26) includes separated drive devices in the driver (203) and H-bridge circuit (205) realized in multiple smaller devices biased separately to reduce transistor self-heating effects and a further embodiment includes a reference (201) having a base cancellation scheme and a Class AB current source for improving accuracy and stability is such high speed devices.

19 Claims, 2 Drawing Sheets

HIGH SPEED PRE-DRIVER WITH VOLTAGE REFERENCE FOR THIN FILM HEAD WRITE DRIVER

FIELD OF THE INVENTION

The present invention is generally related to mass media drive controllers and, more particularly, to a write drive controller for use with a hard disk drive preamplifier.

BACKGROUND OF THE INVENTION

Hard disk drives are mass storage devices that include a magnetic storage media, e.g. rotating disks or platters, a spindle motor, read/write heads, an actuator, a pre-amplifier, a read channel, a write channel, a servo circuit, and control circuitry to control the operation of hard disk drive and to properly interface the hard disk drive to a host system or bus. FIG. 1 shows an example of a prior art disk drive mass storage system 10. Disk drive system 10 interfaces with and exchanges data with a host 32 during read and write operations. Disk drive system 10 includes a number of rotating platters 12 mounted on a base 14. The platters 12 are used to store data that is represented as magnetic transitions on the magnetic platters, with each platter 12 coupleable to a head 16 which transfers data to and from a preamplifier 26. The preamp 26 is coupled to a synchronously sampled data (SSD) channel 28 comprising a read channel and a write channel, and a control circuit 30. SSD channel 28 and control circuit 30 are used to process data being read from and written to platters 12, and to control the various operations of disk drive mass storage system 10. Host 32 exchanges digital data with control circuit 30.

Data is stored and retrieved from each side of the magnetic platters 12 by heads 16 which comprise a read head 18 and a write head 20 at the tip thereof. The conventional read head 18 and write head 20 comprise magneto-resistive heads adapted to read or write data from/to platters 12 when current is passed through them. Heads 16 are coupled to preamplifier 26 that serves as an interface between read/write heads 18/20 of disk/head assembly 10 and SSD channel 28. The preamp 26 provides amplification to the waveform data signals as needed.

The magnetic flux transitions on the magnetic platter 12 are created by switching the write current polarity through the write head 20. Conventionally, four transistors are connected to the write head 20 in a typical H-bridge arrangement in which the direction of current through the write head 20 is controlled by raising the on one node (this voltage level is referred to as the high side voltage) and lowering the voltage on the other node (this voltage level is referred to as the low side voltage). The current direction can be changed by raising the low side voltage such that it becomes the high side and lowering the high side voltage such that it become the low side. Changing the direction of the coil current changes the magnetic flux through the write head 20.

Power dissipation, stable voltage reference, self-heating effects and production costs are some of the major design concerns for coil drive circuitry and are particularly important as the switching speeds increase. For example, during operation, an amplifier circuit consumes current from a power supply in which a portion of this current, known as the quiescent current, is used to bias the internal circuitry of the amplifier. A low quiescent current is most desirable because it reduces power consumption when the amplifier is operable at a light load, or with no load at all. Further, a stable reference and reduced self-heating effects improves the overall performance of the drive circuit.

There is desired an improved high speed write coil driver circuit that improves high data rate operation with reduced power in a reduced cost process. This can be achieved by providing a stable reference with a high speed pre-drive and a fast main writer that operates at reduced power while enabling write operation at very high speed.

SUMMARY

The present invention achieves technical advantages as an apparatus and system for driving of a thin film transducer in a disk drive system for writing at greater than 2 Gb/s. The driver includes a switching circuit coupled in an H-bridge arrangement for switching current polarity through an inductive head and a further circuit coupled with the switching circuit having a pair of voltage follower devices coupled in a cascade arrangement for providing an amplified current signal thereto. In a further embodiment, the voltage followers are class AB devices. In a still further embodiment, switching devices are provided as separate small devices which are biased separately to reduce transistor's self-heating effect. Further, a voltage reference using a base cancellation scheme and class AB current source is use for providing an accurate and stable write signal input to the voltage followers.

BRIEF DESCRIPTION OF THE DRAWINGS

For a more complete understanding of the present invention, reference is made to the following detailed description taken in conjunction with the accompanying drawings wherein.

DETAILED DESCRIPTION

Figure 1:
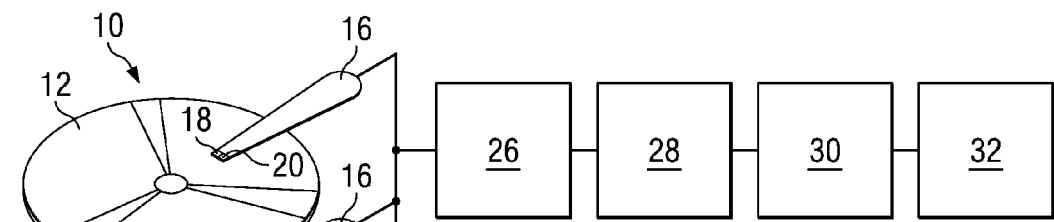
FIG. 1 illustrates a conventional disk drive system.

The numerous innovative teachings of the present write drive controller will be described with particular reference to the presently preferred exemplary embodiments. However, it should be understood that this class of embodiments provides only a few examples of the many advantageous uses and innovative teachings herein. In general, statements made in the specification do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present write drive controller have been omitted for clarity.

A low power/high speed pre-driver is provided for a disk drive system using cascading class A-B buffer and can further include separate drive devices into multiple small devices and have them biased separately to reduce transistor's self-heating effect and an inventive reference using base cancellation scheme and class A-B current source for accuracy and stability. Other solutions need expensive process such as SiGe to achieve 2 Gbs writing. The present invention provides a less expensive alternative for high speed and low power consumption.

Figure 2:
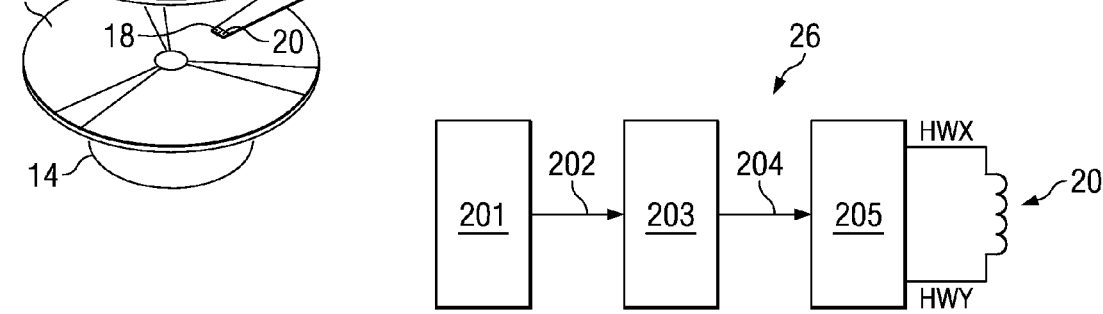
FIG. 2 illustrates a block diagram of a preamp for use in the disk drive system illustrated in FIG. 1 in accordance with exemplary embodiments of the present invention.

Referring now to FIG. 2 there is illustrated a block diagram of a preamp 26 for use in the disk drive system illustrated in FIG. 1 in accordance with exemplary embodiments of the present invention. The preamp 26 includes a reference voltage device 201 which provides a differential voltage signal 202 to a drive device 203. The reference 201 can also include inputs for receiving control signaling corresponding to data to be written to a disk in the disk drive system. Further, the drive 203 provides a differential current signal 204 to a switching device 205. The drive 203 is for building enough current and voltage drive capability since the output current needed to be provided to a typical write head is in a range of approximately 60 mA for steady state conditions and 150 mA in a transient or overshoot condition.

Overall, the preamp 26 provides desired differential switched current outputs at HWY and HWX to the write head 20. The preamp 26 may comprise a single semiconductor chip or may comprise separate components rather than residing on a single chip.

Figure 3A:
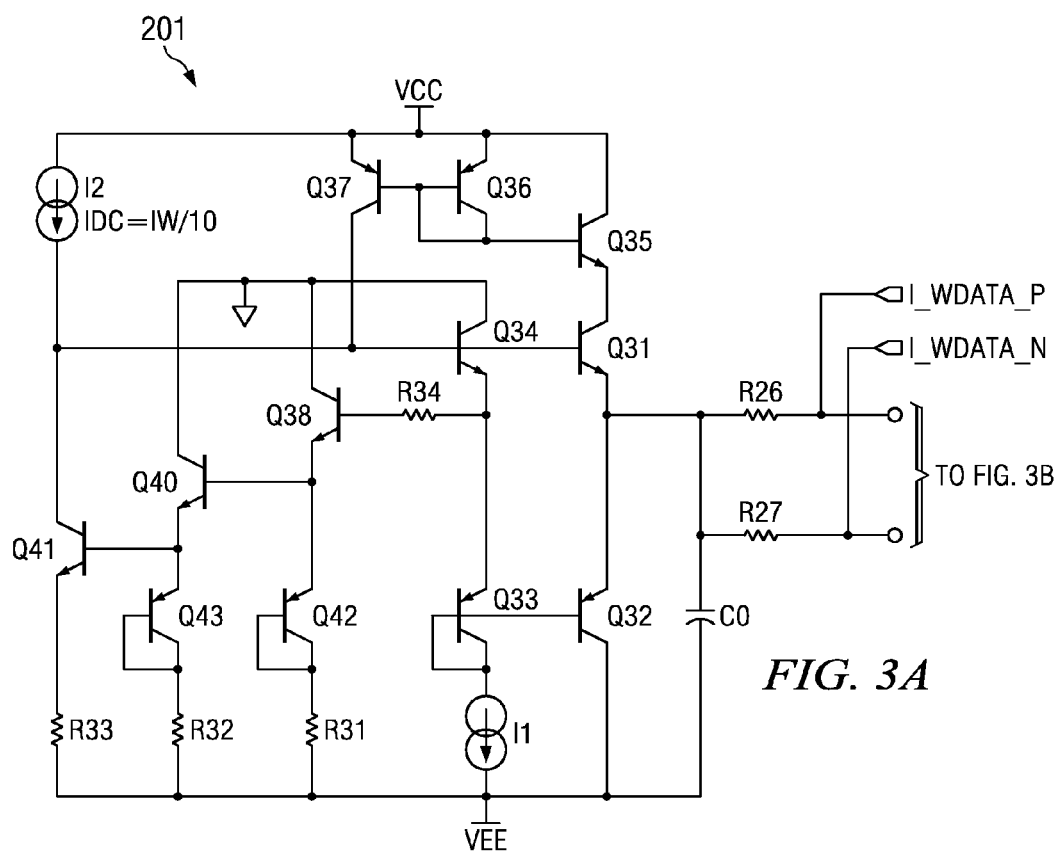
FIGS. 3A and 3B shows a circuit diagram for the preamp in accordance with exemplary embodiments of the present invention.
Figure 3B:
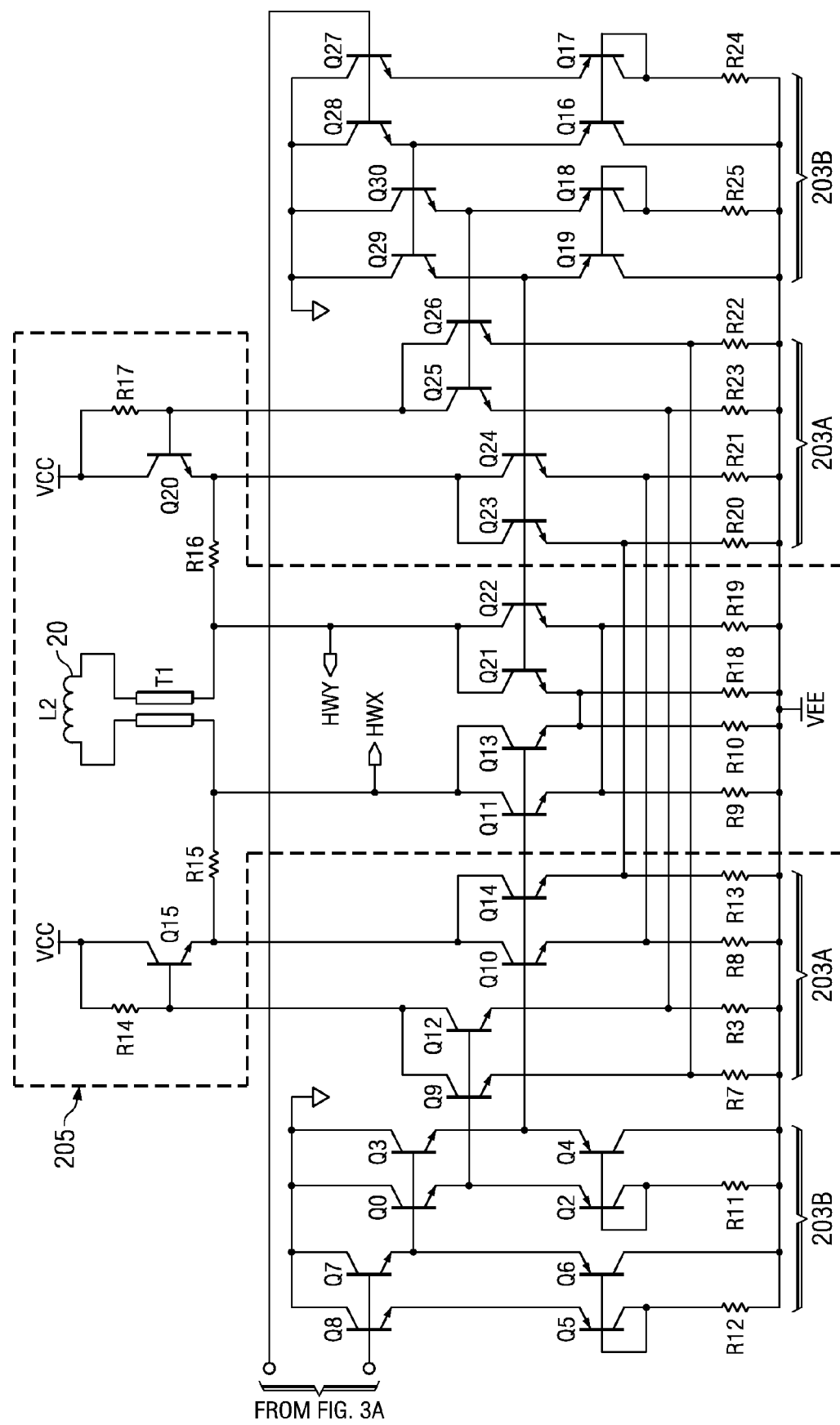

Referring now to FIGS. 3A and 3B there is shown a circuit diagram for the preamp 26 in accordance with exemplary embodiments of the present invention. The differential current outputs HWX and HWY drive the interconnection T1 connected to the thin film transducer L2. The typical supply voltages are: Vcc approximately 5V, Vee approximately −5V and ground. The H-bridge current switch 205 switches the write current Iw through the transducer L2 for writing data to a disk. Resistors R15 and R16 are impedance-matching resistors and which together match the differential impedance of the interconnection T1. More specifically, the H-bridge 205 comprises upper switches Q15, Q20, and lower switches Q11/Q13 and Q21/Q22. The H-bridge 205 further includes associated bias resistors R14, R17, R9–R10, and R18–R19.

The write driver 203 includes a write drive circuit portion 203A comprising components Q9, Q12, Q10, Q14, Q25, Q26, Q23, Q24, and R7, R3, R8, R13, R22, R23, R21, and R20 coupled as shown and a pre-drive circuit portion 203B comprising components Q0, Q2–Q8, R11, R12, and Q6–Q19, Q27–Q30, and R24–R25 coupled as shown.

The preamp 26 further includes the voltage reference 201 with base current compensation and Class AB current source. As shown, the reference 201 comprises Q31, Q34, Q38, Q40–Q43, and R31–R34, and including the base current compensation comprising Q35–Q37, and including the Class AB current source comprising Q32–Q33 and I1. Inputs I_WDATA_P and I_WDATA_N are differential ECL write data current mode inputs. The differential ECL waveform inputs are provided by control circuitry (not shown). An example for providing a desired waveform is described in copending U.S. patent application Ser. No. 09/974,281, filed Oct. 9, 2001, publication number US 2003/0067700, the teaching of which are incorporated herein by reference.

The write data and its boosting in current mode dropped across resistor R26–R27 and the reference voltage at Q31/collector produce differential ECL write data inputs with overshoot to the inputs of the pre-driver circuit 203B. The differential voltage created from the reference 201 and the I_WDATA_P and I_WDATA_N inputs is buffered through the two class AB voltage followers (Q5–Q8 and Q0, Q2–Q4) of the pre-driver 203B which are cascaded to build up drive for the write drive circuit 203A. The Class AB circuit advantageously has a smaller quiescent current. Less operating current means less overall circuit power consumption. Active devices vertical pnps Q5–Q6 and Q2, Q4 are used to reduce standby quiescent current, thus providing very high transient sinking current for very fast pull-down.

In operation, for an improved rise time (i.e., faster rise time) in the write current Iw, the upper H-switch Q15 and Q20 should be turned on a little before the bottom pair Q11, Q13 and Q21-22. This is done by turning on Q9 and Q12 a little earlier with Q0/emitter to base of Q9, Q12.

Typically an H-bridge switching circuit includes only four switching devices. However, the self-heating effects inside transistors (particularly the bottom pair of switches) results in a slow drifting up of the transistor's current with a rise in temperature causing a certain amount of inaccuracy or instability in the write current Iw. For improving the final write current Iw accuracy and/or stability, in accordance with exemplary embodiments of the present invention, the bottom pair of H-bridge switches are separated into multiple devices with the base and collector connected in parallel. Their emitters are connected to separate bias resistors to reduce heating effect. The pairs are Q9/R7, Q12/R3, and Q10/R8, Q14/R13, and Q23/R20, Q24/R21, and Q25/R23, Q26/R22.

Further for improving performance, care should be taken to provide a symmetric write signal by insuring the integrated components (i.e., transistors and resistors) are properly matched and proportioned. Any voltage asymmetry with respect to the positive and negative aspects of the write current Iw can result in degradation of the signal jitter and the overall performance of the preamp 26. Referring to the operation of the reference 201, 1/20 of the write current Iw is the input $I_2$ to the reference circuitry 201. The ratio here is set at 1/20 though other ratios are contemplated. This current going through Q41 and R33 is ratio-ed 1–20 and matched to Q11, Q13, and R9–R10 to produce write current full Iw at the output. The same ratio and match are applied to Q40 and Q3, Q38 and Q7. To produce an accurate write current over a very wide range of 1 mA to 50 mA, base current of the reference's output transistor Q31 is advantageously mirrored and applied back for compensation by Q35–Q37. When switching at high data rate (up to and greater than 2 Gb/s) over a long period of time, the reference voltage at Q31/emitter will start collapsing down. To hold the reference stable, Class A-B current mirror is employed (Q32–Q33 and current I1) with a large holding capacitor C0.

In summation, a preamp 26 is provided for driving of a thin film transducer in a disk drive system for write drive at up to and greater than 2 Gb/s. The preamp 26 achieves technical and/or power advantages driving a thin film transducer, which can be realized in a conventional lower cost BiCMOS process instead of the more expensive SiGe process which are conventionally used when writer speeds begin reaching the 2 Gb/s range. The preamp 26 uses two cascading Class A-B voltage buffers as a high speed write driver 203 to drive a current switch H-bridge 205, enabling the input and output of the driver's characteristics fully symmetric. The use of two cascading Class AB buffers instead of high current three stages Class A emitter followers used in conventional systems also reduces power dissipation of the circuitry. Such an arrangement is shown and described in US 2003/0067700. An associated voltage reference 201 with base current compensation for producing accurate write current over a wide range (1 mA to 50 mA base-peak DC) is also realized which further includes a Class AB current source for holding the reference steady at high speed switching. Further, to reduce self-heating effect in the transistors, separate transistors and separate bias resistors can be used in design and layout of the voltage reference 201, the write driver 203 and the H-bridge 205.

Although exemplary embodiments of the invention are described above in detail, this does not limit the scope of the invention, which can be practiced in a variety of embodiments.

What is claimed is:

1. A driver system for a disk drive, comprising:
   a switching circuit having an upper pair of switching devices and a lower pair of switching devices coupled in an H-bridge arrangement for switching current polarity through an inductive head;
   a write drive circuit couple with said switching circuit and having transistor devices for providing current to said switching circuit; and
   a pre-drive circuit coupled with said write drive circuit for providing an amplified signal thereto and having a first voltage follower device coupled in a cascade arrangement to a second voltage follower device.

2. The driver system of claim 1, wherein each of said voltage follower devices comprise a plurality of transistors biased Class AB operable.

3. The driver system of claim 2, wherein each of said voltage follower devices further comprise a quiescent current reduction devices.

4. The driver system of claim 1, wherein each of said voltage follower devices comprise a first transistor, a second transistor, a third transistor and a fourth transistor operable in a Class AB biasing arrangement.

5. The driver system of claim 1, further comprising a reference circuit coupled with said pre-drive circuit for providing a differential ECL data signals to said pre-driver circuit.

6. The driver system of claim 5, wherein said reference circuit comprises:
   an output transistor having a base, collector and emitter; and
   a current device coupled with said base and collector for providing a compensation current to base.

7. A driver system for a disk drive, comprising:
   a switching circuit having an upper pair of switching devices and a lower pair of switching devices coupled in an H-bridge arrangement for switching current polarity through an inductive head;
   a write drive circuit coupled with said switching circuit and having transistor devices for providing current to said switching circuit;
   a pre-drive circuit coupled with said write drive circuit for providing an amplified signal thereto and having a pair of voltage follower devices coupled in a cascade arrangement; and
   a reference circuit coupled with said pre-drive circuit for providing a differential ECL data signals to said pre-driver circuit
   wherein said reference circuit further comprises a Class AB operable current mirror coupled with said transistor emitter for stabilizing the voltage at increased switching speeds.

8. The driver system of claim 1, wherein each of said write drive circuit transistor devices comprises a pair of transistors each having a base, collector and emitter, wherein said bases and collectors are coupled in parallel and said emitters are coupled to bias resistors for reducing self-heating effects.

9. The driver system of claim 1, wherein said upper pair switching devices are transistors with a first node defined therebetween and each of said lower pair switching devices comprises a pair of transistors with a second node defined therebetween, wherein said first and second nodes are adapted to drive said inductive head.

10. The driver system of claim 9, wherein each of said pairs of transistors have a base and a collector coupled in parallel and having emitters coupled to bias resistors for reducing self-heating effects.

11. A preamplifier for driving an H-bridge switching circuit in a disk drive system, comprising:
   a write drive circuit coupled with said switching circuit and having transistor devices for providing current to said switching circuit; and
   a pre-drive circuit coupled with said write drive circuit for providing an amplified signal thereto and having a first voltage follower device coupled in a cascade arrangement to a second voltage follower device.

12. The preamplifier of claim 11, wherein each of said voltage follower devices comprise a plurality of transistors biased Class AB operable.

13. The preamplifier of claim 11, wherein each of said voltage follower devices further comprise a quiescent current reduction devices.

14. The preamplifier of claim 11, wherein each of said voltage follower devices comprise a first transistor, a second transistor, a third transistor and a fourth transistor operable in a Class AB biasing arrangement.

15. The preamplifier of claim 11 further comprising a reference circuit coupled with said pre-drive circuit for providing a differential ECL data signals to said pre-driver circuit.

16. The preamplifier of claim 15, wherein said reference circuit comprises:
   an output transistor having a base, collector and emitter; and
   a current device coupled with said base and collector for providing a compensation current to base.

17. A preamplifier for driving an H-bridge switching circuit in a disk drive system, comprising:
   a write drive circuit coupled with said switching circuit and having transistor devices for providing current to said switching circuit;
   a pre-drive circuit coupled with said write drive circuit for providing an amplified signal thereto and having a pair of voltage follower devices coupled in a cascade arrangement; and
   a reference circuit coupled with said pre-drive circuit for providing a differential ECL data signals to said pre-driver circuit,
   wherein said reference circuit comprises:
   an output transistor having a base, collector and emitter; and
   a current device coupled with said base and collector for providing a compensation current to base,
   wherein said reference circuit further comprises a Class AB operable current mirror coupled with said transistor emitter for stabilizing the voltage at increased switching speeds.

18. The preamplifier of claim 11, wherein each of said write drive circuit transistor devices comprises a pair of transistors each having a base, collector and emitter, wherein said bases and collectors are coupled in parallel and said emitters are coupled to bias resistors for reducing self-heating effects.

19. A method for providing a current for driving an inductive head of a disk drive system responsive to a control signal, comprising:
   providing a reference signal responsive to said control signal, said reference signal is provided via an output transistor having a base, collector and emitter; wherein a compensation circuit is coupled with said base and collector for providing a compensation current to said base and a Class AB operable current mirror is coupled with said emitter for stabilizing the voltage;

amplifying said reference signal via transistors operably arranged in a Class AB biasing arrangement; and providing said amplified signal as a current signal to a switching circuit for switching current polarity through said inductive head, wherein said switching circuit has upper pair of switching devices and a lower pair of switching devices coupled in a conventional H-bridge arrangement.

* * * * *